(12) United States Patent  
Seddon

(10) Patent No.: US 10,096,460 B2  
(45) Date of Patent: Oct. 9, 2018

(54) SEMICONDUCTOR WAFER AND METHOD OF WAFER THINNING USING GRINDING PHASE AND SEPARATION PHASE

(71) Applicant: SEMICONDUCTOR COMPONENTS INDUSTRIES, LLC, Phoenix, AZ (US)

(72) Inventor: Michael J. Seddon, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 127 days.

(21) Appl. No.: 15/226,362

(22) Filed: Aug. 2, 2016

(65) Prior Publication Data

US 2018/0040469 A1    Feb. 8, 2018

(51) Int. Cl.
| | |
|---|---|
| *B24B 7/22* | (2006.01) |
| *H01L 21/02* | (2006.01) |
| *H01L 21/67* | (2006.01) |
| *H01L 23/544* | (2006.01) |
| *H01L 21/78* | (2006.01) |
| *H01L 21/768* | (2006.01) |
| *H01L 21/66* | (2006.01) |
| *B24B 55/06* | (2006.01) |

(52) U.S. Cl.
CPC ........ *H01L 21/02013* (2013.01); *B24B 7/228* (2013.01); *B24B 55/06* (2013.01); *H01L 21/02052* (2013.01); *H01L 21/6704* (2013.01); *H01L 21/76879* (2013.01); *H01L 21/76898* (2013.01); *H01L 21/78* (2013.01); *H01L 22/14* (2013.01); *H01L 23/544* (2013.01); *H01L 2223/54453* (2013.01)

(58) Field of Classification Search
CPC ......... B24B 7/228; B24B 55/06; B24B 53/07; B24B 53/12; B24B 53/00; B24B 53/10; H01L 21/02013
USPC ................ 451/5, 7, 41, 53, 57, 67, 444, 450
See application file for complete search history.

(56) References Cited

U.S. PATENT DOCUMENTS

| | | | | |
|---|---|---|---|---|
| 5,522,965 A | * | 6/1996 | Chisholm | ................. B24B 1/04 156/345.12 |
| 5,545,076 A | * | 8/1996 | Yun | ......................... B08B 3/02 134/148 |
| 5,868,866 A | * | 2/1999 | Maekawa | ............... B08B 1/007 134/1 |

(Continued)

*Primary Examiner* — George Nguyen  
(74) *Attorney, Agent, or Firm* — IPTechLaw

(57) ABSTRACT

A semiconductor wafer has a base material. The semiconductor wafer may have an edge support ring. A grinding phase of a surface of the semiconductor wafer removes a portion of the base material. The grinder is removed from or lifted off the surface of the semiconductor wafer during a separation phase. The surface of the semiconductor wafer and under the grinder is rinsed during the grinding phase and separation phase to remove particles. A rinsing solution is dispensed from a rinsing solution source to rinse the surface of the semiconductor wafer. The rinsing solution source can move in position while dispensing the rinsing solution to rinse the surface of the semiconductor wafer. The grinding phase and separation phase are repeated during the entire grinding operation, when grinding conductive TSVs, or during the final grinding stages, until the final thickness of the semiconductor wafer is achieved.

20 Claims, 6 Drawing Sheets

(56) References Cited

U.S. PATENT DOCUMENTS

| | | | | |
|---|---|---|---|---|
| 5,957,757 | A * | 9/1999 | Berman | B24B 53/017 451/443 |
| 6,138,690 | A * | 10/2000 | Nakatani | H01L 21/31111 134/1.3 |
| 6,227,956 | B1 * | 5/2001 | Halley | B24B 37/11 451/288 |
| 6,276,997 | B1 * | 8/2001 | Li | H01L 21/02079 134/1.3 |
| 6,319,105 | B1 * | 11/2001 | Togawa | B24B 53/017 134/153 |
| 6,332,833 | B1 * | 12/2001 | Ohshima | B24B 7/228 125/11.01 |
| 6,340,326 | B1 * | 1/2002 | Kistler | B24B 37/26 451/286 |
| 6,439,962 | B1 * | 8/2002 | Ato | B08B 1/04 451/6 |
| 6,443,816 | B2 * | 9/2002 | Inoue | B24B 53/017 451/444 |
| 6,547,651 | B1 * | 4/2003 | Boyd | B24B 37/20 451/285 |
| 7,572,172 | B2 * | 8/2009 | Aoyama | B24B 37/30 451/444 |
| 7,910,157 | B2 * | 3/2011 | Terada | H01L 21/67219 427/331 |
| 8,147,617 | B2 * | 4/2012 | Sekiguchi | B08B 3/02 134/18 |
| 8,562,392 | B2 * | 10/2013 | Shiratani | B24B 53/017 451/443 |
| 9,700,988 | B2 * | 7/2017 | Yamaguchi | B24B 53/017 |
| 2002/0022445 | A1 * | 2/2002 | Sotozaki | B08B 1/04 451/444 |
| 2002/0061647 | A1 * | 5/2002 | Kawamoto | H01L 21/02052 438/689 |
| 2007/0066184 | A1 * | 3/2007 | Nagamoto | B24B 37/042 451/41 |
| 2008/0214094 | A1 * | 9/2008 | Katoh | B24B 9/14 451/41 |
| 2009/0247056 | A1 * | 10/2009 | Masuda | B24B 7/228 451/54 |
| 2010/0248597 | A1 * | 9/2010 | Sakata | B24B 53/017 451/56 |
| 2012/0231705 | A1 * | 9/2012 | Tanaka | H01L 21/6838 451/41 |
| 2013/0023186 | A1 * | 1/2013 | Motoshima | B24B 55/02 451/7 |
| 2013/0023188 | A1 * | 1/2013 | Wei | B24D 7/14 451/41 |
| 2013/0052812 | A1 * | 2/2013 | Nakata | H01L 21/304 438/514 |
| 2014/0323017 | A1 * | 10/2014 | Tang | B24B 53/017 451/56 |
| 2015/0290767 | A1 * | 10/2015 | Sugiyama | H01L 21/67219 451/444 |
| 2016/0064230 | A1 * | 3/2016 | Nishihara | H01L 21/304 451/41 |

* cited by examiner

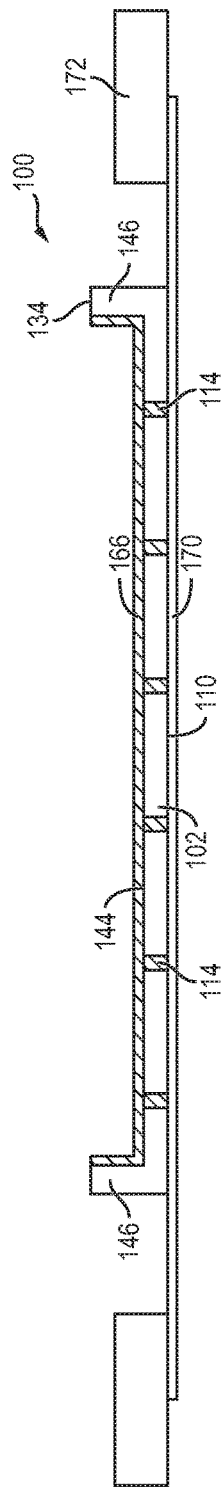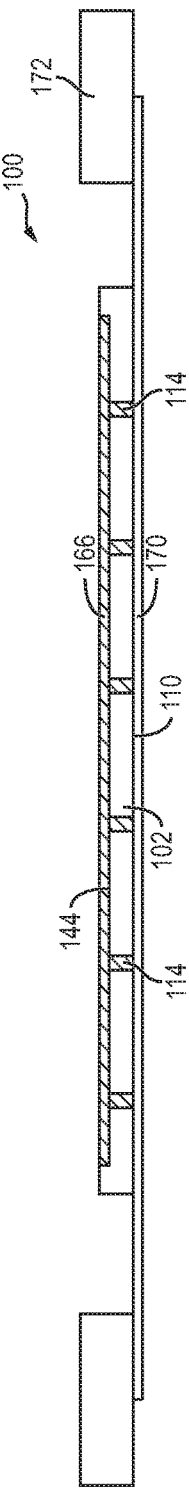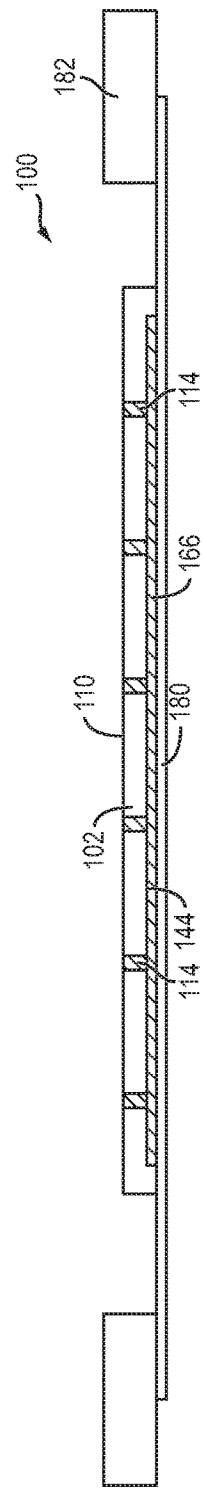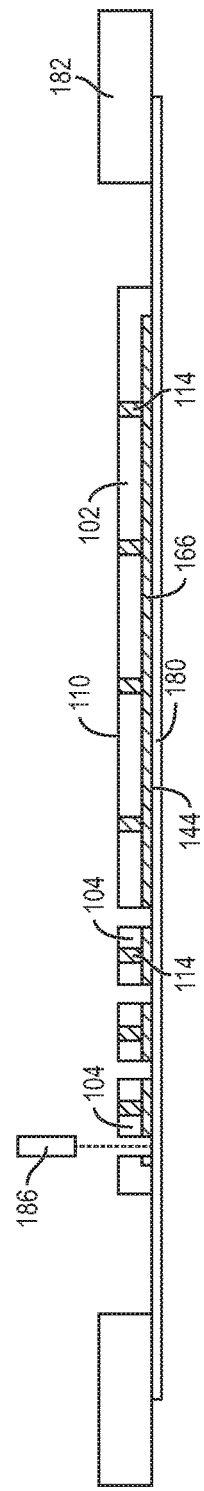

US 10,096,460 B2

SEMICONDUCTOR WAFER AND METHOD OF WAFER THINNING USING GRINDING PHASE AND SEPARATION PHASE

FIELD OF THE INVENTION

The present invention relates in general to semiconductor devices and, more particularly, to a semiconductor wafer and method of wafer thinning using a grinding phase and separation phase to reduce surface damage.

BACKGROUND

Semiconductor devices are commonly found in modern electronic products. Semiconductor devices vary in the number and density of electrical components. Semiconductor devices perform a wide range of functions such as analog and digital signal processing, sensors, transmitting and receiving electromagnetic signals, controlling electronic devices, power management, and audio/video signal processing. Discrete semiconductor devices generally contain one type of electrical component, e.g., light emitting diode (LED), small signal transistor, resistor, capacitor, inductor, diodes, rectifiers, thyristors, and power metal-oxide-semiconductor field-effect transistor (MOSFET). Integrated semiconductor devices typically contain hundreds to millions of electrical components. Examples of integrated semiconductor devices include microcontrollers, application specific integrated circuits (ASIC), power conversion, standard logic, amplifiers, clock management, memory, interface circuits, and other signal processing circuits.

A semiconductor wafer includes a base substrate material and plurality of semiconductor die formed on an active surface of the wafer separated by a saw street. FIG. 1a shows a conventional semiconductor wafer 10 with base substrate material 12, active surface 14, and back surface 16. Conductive vias 18 are formed through semiconductor wafer 10 for electrical interconnect. Conductive vias 18 are created prior to wafer thinning and may be made of tungsten or other hard metal, sometimes with an oxide material between the conductive via and base substrate material 12 for isolation.

Many applications require the semiconductor die to be reduced in height or thickness to minimize the size of the semiconductor package. FIG. 1b shows a grinding operation with grinding wheel 20 removing a portion of base substrate material 12 from back surface 16 of semiconductor wafer 10 and reducing the thickness of the semiconductor wafer. Grinding wheel 20 operates on a constant feed rate of the grinding wheel into the grinding surface. Grinding wheel 20 typically goes through some portion of base substrate material 12 before reaching conductive vias 18. The grinding operation leaves particles 22 from base substrate material 12, conductive vias 18, and grinding wheel 20, and other contaminants on the grinding surface. The particles and contaminants 22 become lodged between grinding wheel teeth 21, and between grinding wheel 20 and base substrate material 12. The grinding wheel rotation with the various particles and contaminants 22 form surface cracks, gouges, and other damage 24 in final post-grinding surface 26, as shown in FIG. 1c. In particular, the tungsten conductive vias 18 are brittle and break apart and become lodged between the grinding wheel and grinding surface, leaving the cracks, gouges, scratches, and other damage 24 in final post-grinding surface 26. The damage to final surface 26 may cause semiconductor wafer 10 to fail inspection. In addition, the cracks, gouges, and other damage 24 in final post-grinding surface 26 may create stress concentration points which can lead to wafer and die breakage and reduce production yield.

DETAILED DESCRIPTION OF THE DRAWINGS

The following describes one or more embodiments with reference to the figures, in which like numerals represent the same or similar elements. While the figures are described in terms of the best mode for achieving certain objectives, the description is intended to cover alternatives, modifications, and equivalents as may be included within the spirit and scope of the disclosure. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer may contain active and passive electrical components and optical devices, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions. The optical device detects and records an image by converting the variable attenuation of light waves or electromagnetic radiation into electric signals.

Back-end manufacturing refers to cutting or singulating the finished wafer into the individual semiconductor die and packaging the semiconductor die for structural support, electrical interconnect, and environmental isolation. The wafer is singulated using plasma etching, laser cutting tool, or saw blade along non-functional regions of the wafer called saw streets or scribes. After singulation, the individual semiconductor die are mounted to a package substrate that includes pins or interconnect pads for interconnection with other system components. Interconnect pads formed over the semiconductor die are then connected to interconnect pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
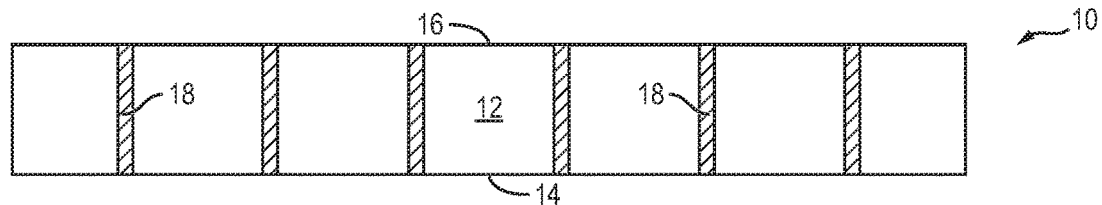
FIGS. 1a-1c illustrate a conventional semiconductor wafer grinding process leaving cracks, gouges, and other damage in final post-grinding surface.
Figure 1B:
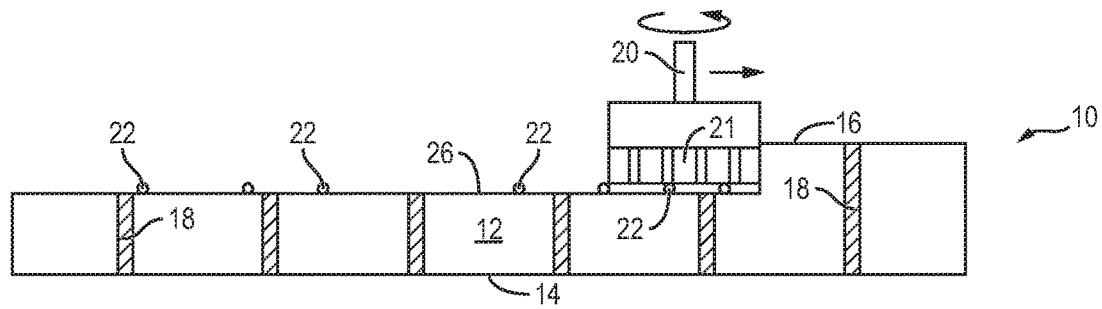
Figure 1C:
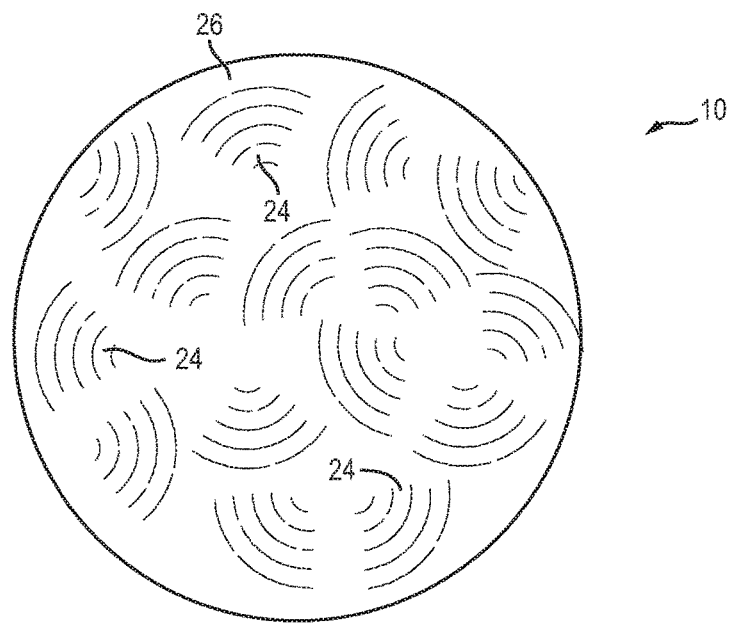
Figure 2A:
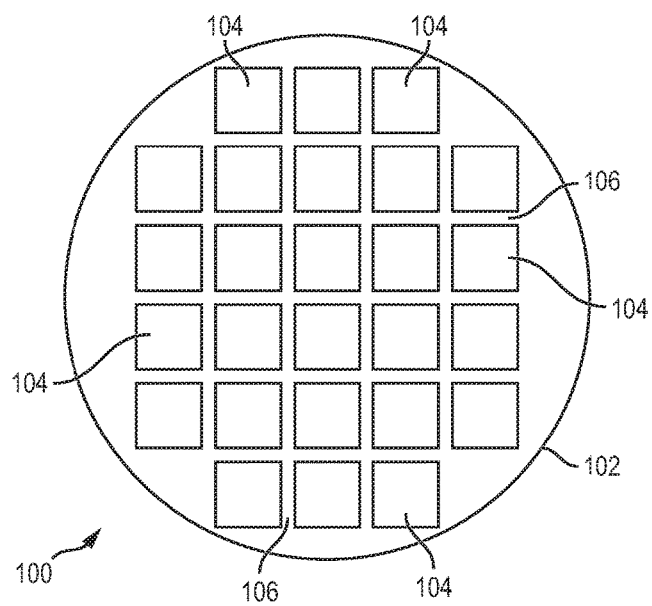
FIGS. 2a-2c illustrate a semiconductor wafer with a plurality of semiconductor die separated by a saw street.

FIG. 2a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die 104 is formed on wafer 100 separated by non-active saw street 106, as described above. Saw street 106 provides singulation areas to separate semiconductor wafer 100 into individual semiconductor die 104. In one embodiment, semiconductor wafer 100 has a width or diameter of 100-450 millimeters (mm) and thickness of 675-775 micrometers (μm). In another embodiment, semiconductor wafer 100 has a width or diameter of 150-300 mm.

Figure 2B:
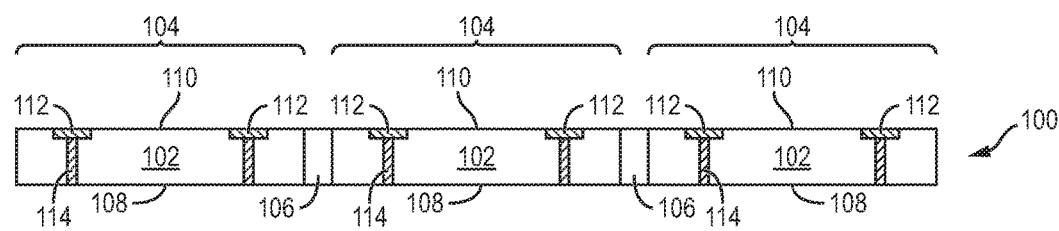

FIG. 2b shows a cross-sectional view of a portion of semiconductor wafer 100. Each semiconductor die 104 has a back surface 108 and an active surface or region 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface or region 110 to implement analog circuits or digital circuits, such as digital signal processor (DSP), microcontrollers, ASIC, power conversion, standard logic, amplifiers, clock management, memory, interface circuits, and other signal processing circuit. Semiconductor die 104 may also contain integrated passive devices (IPDs), such as inductors, capacitors, and resistors, for RF signal processing. Active surface 110 may contain an image sensor area implemented as semiconductor charge-coupled devices (CCD) and active pixel sensors in complementary metal-oxide-semiconductor (CMOS) or N-type metal-oxide-semiconductor (NMOS) technologies. Alternatively, semiconductor die 104 can be an optical lens, detector, vertical cavity surface emitting laser (VCSEL), waveguide, stacked die, electromagnetic (EM) filter, or multi-chip module.

An electrically conductive layer 112 is formed over active surface 110 using PVD, CVD, electrolytic plating, electroless plating process, evaporation, or other suitable metal deposition process. Conductive layer 112 includes one or more layers of aluminum (Al), copper (Cu), tin (Sn), nickel (Ni), gold (Au), silver (Ag), tungsten (W), titanium (Ti), titanium tungsten (TiW), or other suitable electrically conductive material. Conductive layer 112 operates as interconnect pads electrically connected to the circuits on active surface 110.

A plurality of vias is formed through semiconductor wafer 100 using mechanical drilling, laser drilling, or deep reactive ion etching (DRIE). The vias are filled with Al, Cu, Sn, Ni, Au, Ag, W, Ti, TiW, poly-silicon, or other suitable electrically conductive material using electrolytic plating, electroless plating process, or other suitable metal deposition process to form z-direction conductive through silicon vias (TSV) 114 embedded within semiconductor die 104.

Semiconductor wafer 100 undergoes electrical testing and inspection as part of a quality control process. Manual visual inspection and automated optical systems are used to perform inspections on semiconductor wafer 100. Software can be used in the automated optical analysis of semiconductor wafer 100. Visual inspection methods may employ equipment such as a scanning electron microscope, high-intensity or ultra-violet light, metallurgical microscope, or optical microscope. Semiconductor wafer 100 is inspected for structural characteristics including warpage, thickness variation, surface particulates, irregularities, cracks, delamination, contamination, and discoloration.

Figure 2C:
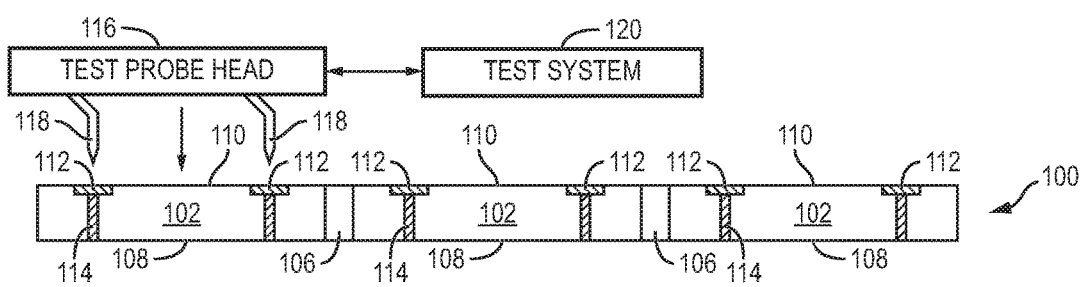

The active and passive components within semiconductor die 104 undergo testing at the wafer level for electrical performance and circuit function. Each semiconductor die 104 is tested for functionality and electrical parameters, as shown in FIG. 2c, using a test probe head 116 including a plurality of probes or test leads 118, or other testing device. Probes 118 are used to make electrical contact with nodes or conductive layer 112 on each semiconductor die 104 and provide electrical stimuli to interconnect pads 112. Semiconductor die 104 responds to the electrical stimuli, which is measured by computer test system 120 and compared to an expected response to test functionality of the semiconductor die. The electrical tests may include circuit functionality, lead integrity, resistivity, continuity, reliability, junction depth, ESD, RF performance, drive current, threshold current, leakage current, and operational parameters specific to the component type. The inspection and electrical testing of semiconductor wafer 100 enables semiconductor die 104 that pass to be designated as known good die for use in a semiconductor package.

Figure 3A:
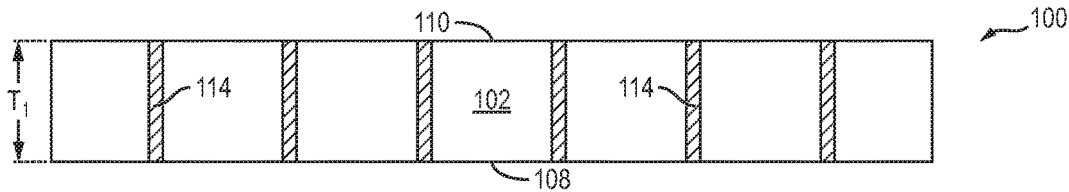
FIGS. 3a-3n illustrate a process of wafer thinning using a grinding phase and separation phase to reduce surface damage.

FIGS. 3a-3n illustrate a process of wafer thinning using a grinding phase and separation phase to reduce surface damage. FIG. 3a shows an entire area of semiconductor wafer 100 with back surface 108, active surface 110, and conductive TSV 114. Semiconductor die 104 are present in active surface 110, see FIGS. 2a-2c, but not labeled for purposes of the present explanation. Semiconductor wafer 100 has a pre-grinding thickness $T_1$ of 675-775 μm.

Figure 3B:
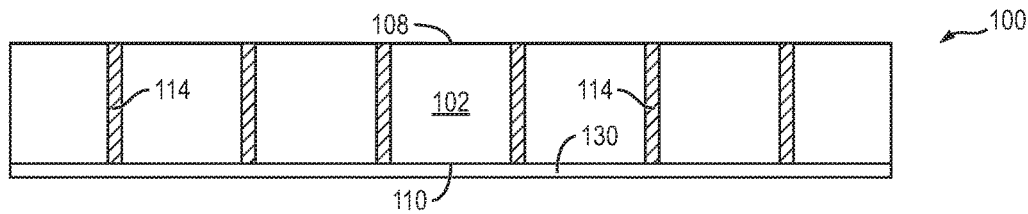
Figure 3C:
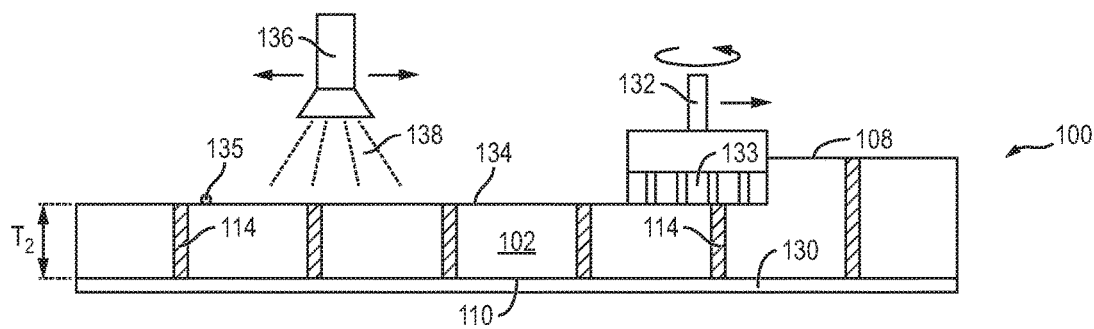

In FIG. 3b, semiconductor wafer 100 is inverted and mounted with active surface 110 oriented to backgrinding tape 130. In FIG. 3c, the entire back surface 108 undergoes a first grinding operation with grinder or grinding wheel 132 rotating and semiconductor wafer 100 rotating to remove a portion of base substrate material 102. More specifically, grinding wheel 132 is applied to base substrate material 102 at time $t_1$ and moves in a cyclic, spinning pattern. A small portion of the grinding surface is removed with each pass. The grinding phase leaves particles 135 from base substrate material 102, conductive TSV 114, and grinding wheel 132, and other contaminants on the grinding surface. The particles and contaminants 135 become lodged between grinding wheel teeth 133, and between grinding wheel 132 and the grinding surface. To remove particles and contaminants 135, particularly from under grinding wheel 132, the grinding wheel moves in the z-direction to physically separate the grinding wheel from base substrate material 102. The downward movement of the grinding wheel can be paused instead of reversed, to allow the rinse water to clear the particles.

Figure 3D:
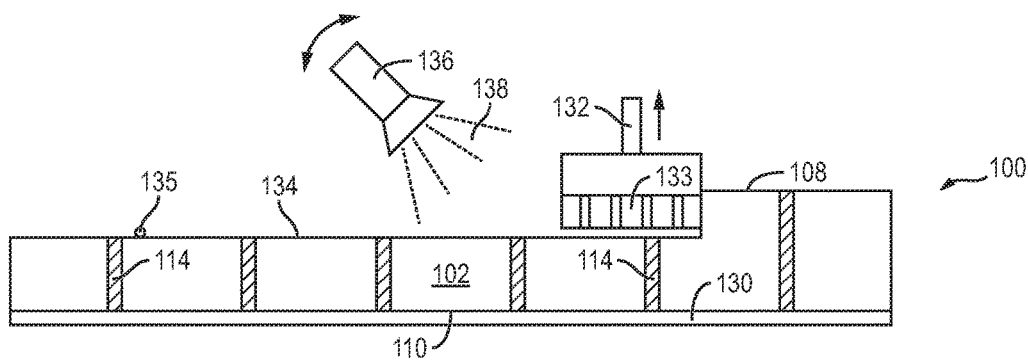

FIG. 3d shows grinding wheel 132 lifting off base substrate material 102 at time $t_2$ during a lift-off or separation phase.

Figure 3E:
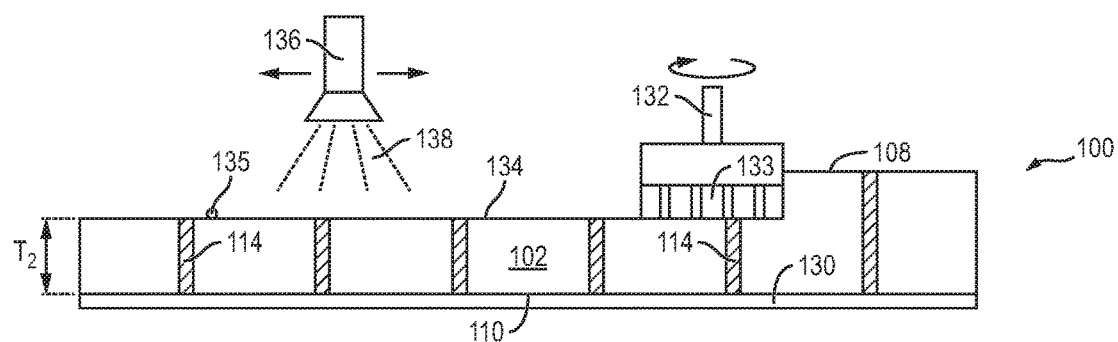

In FIG. 3e, grinding wheel 132 is again applied to base substrate material 102 during another grinding phase at time $t_3$. There are typically many cycles of grinding phase and separation phase with a small portion of the grinding surface removed each pass.

During grinding phase period $t_1$-$t_2$ and separation phase period $t_2$-$t_3$, rinsing solution source 136 continuously dispenses a rinsing solution or water 138 to the grinding surface to wash away particles and contaminants 135. During separation phase period $t_2$-$t_3$, when grinding wheel 132 lifts off the grinding surface, rinsing solution 138 clears most if not substantially all particles and contaminants 135 from under grinding wheel 132 and between grinding wheel teeth 133. The rotation of semiconductor wafer 100 and the volume of rinsing solution 138 disperses particles and contaminants 135 from under grinding wheel 132, between grinding teeth 133, and from the grinding surface.

Grinding wheel 132 may lift off surface 134 at time $t_2$, stop rotation, and reverse direction of rotation between time $t_2$ and time $t_3$. Grinding wheel 132 may pause in vertical movement during the separation phase, or pause in rotational movement during the grinding phase and/or separation phase. The grinding phase period $t_1$-$t_2$ and separation phase period $t_2$-$t_3$ repeat during the first backgrinding operation until the desired thickness of semiconductor wafer 100 is achieved. The duration of grinding phase period $t_1$-$t_2$ is 5-30 seconds, and the duration of separation phase period $t_2$-$t_3$ is 3-10 seconds. In one embodiment, grinding wheel 132 lifts off or moves 3-10 μm in the z-direction away from base substrate material 102, or a sufficient height to clear most if not substantially all particles and contaminants 135 from grinding wheel teeth 133. Rinsing solution 138 washes away particles and contaminants 135 during the separation phase period $t_2$-$t_3$, as well as during the grinding phase period $t_1$-$t_2$. Alternatively, rinsing solution 138 is applied in pulses to wash away particles and contaminants 135. Rinsing solution source 136 may swivel, rotate, or move about in a pattern over the grinding surface for an even and thorough distribution of rinsing solution 138.

By lifting grinding wheel 132 from the grinding surface and rinsing away particles and contaminants 135 originating from the grinding operation, either while rotating or paused, the final surface 134 is relatively free of the cracks, gouges, and other damage, as noted in the background. The repeating grinding phase period $t_1$-$t_2$ and separation phase period $t_2$-$t_3$ may be practiced during the entire grinding operation, when grinding conductive TSVs 114, or during the final grinding stages. Grinding wheel 132 can be designed with a slower wheel wear rate. Semiconductor wafer 100 has a post-grinding thickness $T_2$ of about 355 μm between active surface 110 and final post-grinding surface 134.

In another embodiment, grinding wheel 132 may stop rotation, slow down the rotation, or spin slower than normal rate after the grinding phase at time $t_2$, while the grinding wheel remains on surface 134. Rinsing solution source 136 continuously dispenses a rinsing solution or water 138 to the grinding surface to wash away particles and contaminants 135. At time $t_3$, grinding wheel 132 re-starts rotation in the previous direction or reverses direction of rotation. The grinding phase and stop phase repeat during the first backgrinding operation until the desired thickness of semiconductor wafer 100 is achieved.

Figure 3F:
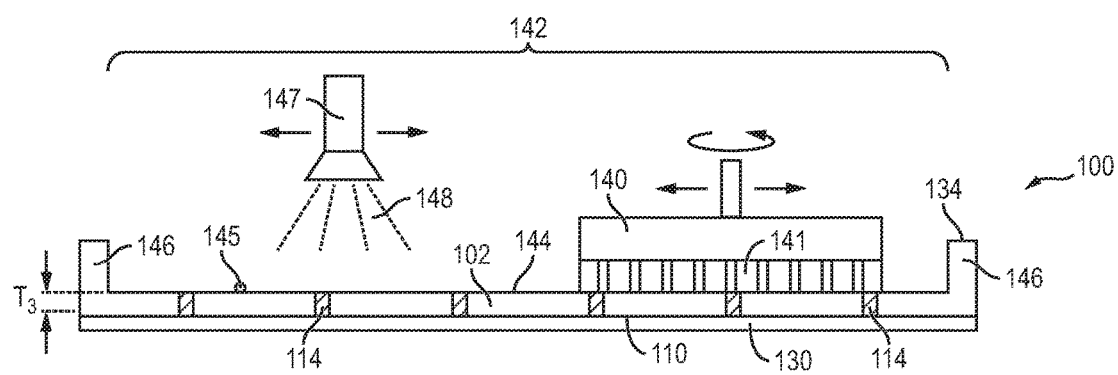

In FIG. 3f, a second grinding operation is applied to surface 134 with grinder or grinding wheel 140 rotating and semiconductor wafer 100 rotating to remove a portion of base substrate material 102. Grinding wheel 140 moves in a cyclic, spinning pattern across an interior region or wafer grinding area 142 of semiconductor wafer 100. A small portion of the grinding surface is removed with each pass. Grinding wheel 140 is controlled to leave edge support ring 146 of base substrate material 102 around a perimeter of semiconductor wafer 100 for structural support.

Figure 3G:
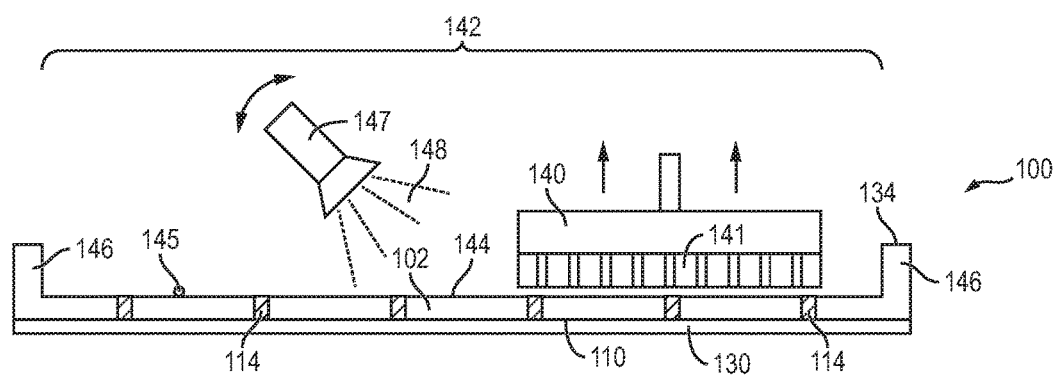

More specifically, grinder or grinding wheel 140 is applied to base substrate material 102 at time $t_1$, as shown in FIG. 3f. The grinding phase leaves particles 145 from base substrate material 102, conductive TSV 114, and grinding wheel 140, and other contaminants on the grinding surface. The particles and contaminants 145 become lodged between grinding wheel teeth 141, and between grinding wheel 140 and the grinding surface. To remove particles and contaminants 145, particularly from under grinding wheel 140, the grinding wheel moves in the z-direction to physically separate the grinding wheel from base substrate material 102. FIG. 3g shows grinding wheel 140 lifting off base substrate material 102 at time $t_2$ during a lift-off or separation phase.

Figure 3H:
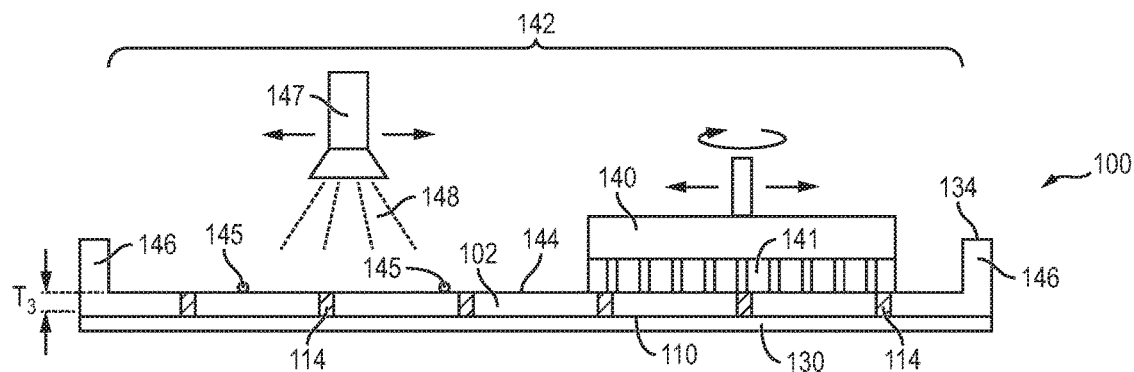

In FIG. 3h, grinding wheel 140 is again applied to base substrate material 102 during another grinding phase at time $t_3$. There are typically many cycles of grinding phase and separation phase with a small portion of the grinding surface removed each pass.

During grinding phase period $t_1$-$t_2$ and separation phase period $t_2$-$t_3$, rinsing solution source 147 continuously dispenses a rinsing solution or water 148 to the grinding surface to wash away particles and contaminants 145. During separation phase $t_2$-$t_3$, when grinding wheel 140 lifts off the grinding surface, rinsing solution 148 clears most if not substantially all particles and contaminants 145 from under grinding wheel 140 and between grinding wheel teeth 141. The rotation of semiconductor wafer 100 and the volume of rinsing solution 148 disperses particles and contaminants 145 from under grinding wheel 140, between grinding teeth 141, and from the grinding surface.

Grinding wheel 140 may lift off surface 144 at time $t_2$, stop rotation, and reverse direction of rotation between time $t_2$ and time $t_3$. Grinding wheel 140 may pause in vertical movement during the separation phase, or pause in rotational movement during the grinding phase and/or separation phase. The grinding phase period $t_1$-$t_2$ and separation phase period $t_2$-$t_3$ repeat during the second backgrinding operation until the desired thickness of semiconductor wafer 100 is achieved. The duration of grinding phase period $t_1$-$t_2$ is 5-30 seconds, and the duration of separation phase period $t_2$-$t_3$ is 3-10 seconds. In one embodiment, grinding wheel 140 lifts off or moves 3-10 μm in the z-direction away from base substrate material 102, or a sufficient height to clear most if not substantially all particles and contaminants 145 from grinding wheel teeth 141. Rinsing solution 148 washes away particles and contaminants 145 during the separation phase period $t_2$-$t_3$, as well as during the grinding phase period $t_1$-$t_2$. Alternatively, rinsing solution 148 is applied in pulses to wash away particles and contaminants 145. Rinsing solution source 147 may swivel, rotate, or move about in a pattern over the grinding surface for an even and thorough distribution of rinsing solution 158.

By lifting grinding wheel 140 from the grinding surface and rinsing away particles and contaminants 145 originating from the grinding operation, either while rotating or paused, the final surface 144 is relatively free of the cracks, gouges, and other damage, as noted in the background. The repeating grinding phase period $t_1$-$t_2$ and separation phase period $t_2$-$t_3$ may be practiced during the entire grinding operation, when grinding conductive TSVs 114, or during the final grinding stages. Grinding wheel 140 can be designed with a slower wheel wear rate. In one embodiment, the post-grinding thickness $T_3$ of semiconductor wafer 100 is 75 μm or less. In another embodiment, the post-grinding thickness $T_3$ of semiconductor wafer 100 is 10-50 μm.

In another embodiment, grinding wheel 140 may stop rotation after the grinding phase at time $t_2$, while the grinding wheel remains on surface 134. Rinsing solution source 147 continuously dispenses a rinsing solution or water 148 to the grinding surface to wash away particles and contaminants 145. At time $t_3$, grinding wheel 140 re-starts rotation in the previous direction or reverses direction of rotation. The grinding phase and stop phase repeat during the first backgrinding operation until the desired thickness of semiconductor wafer 100 is achieved.

Figure 3I:
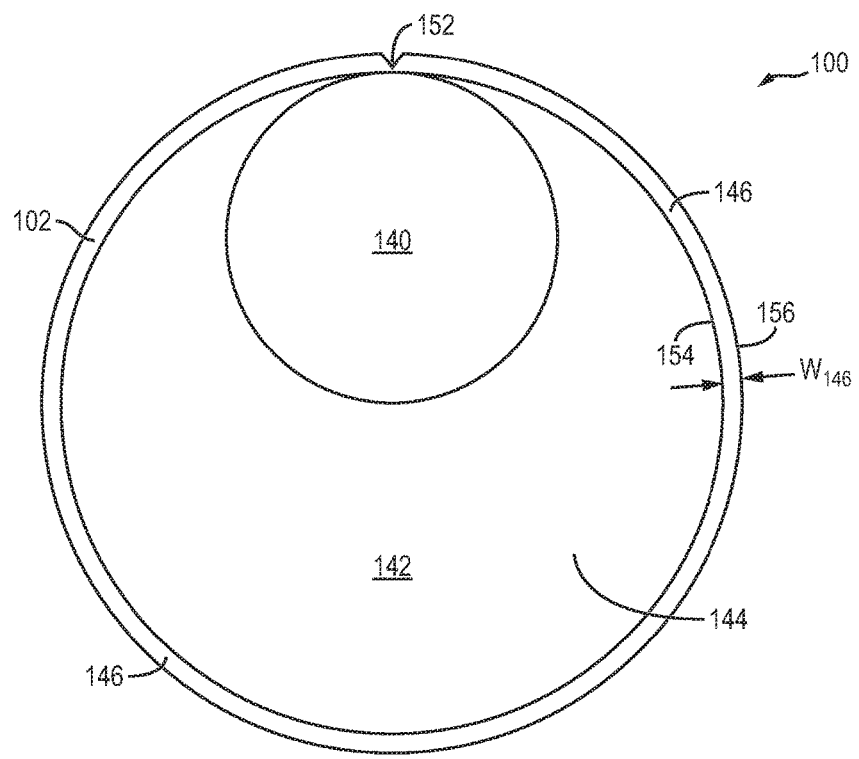

FIG. 3i shows a top view of grinding wheel 140 removing a portion of surface 134 of semiconductor wafer 100 to reduce the thickness of the semiconductor wafer, and correspondingly semiconductor die 104, in grinding area 142, while leaving edge support ring 146 of base substrate material 102 around a perimeter of the semiconductor wafer. Edge support ring 146 has a width $W_{146}$ is 3.0 mm±0.3 mm from inner wall 154 to outer edge 156 of semiconductor wafer 100. The height of edge support ring 146 is the first post-grinding thickness $T_2$, which is greater than the second post-grinding thickness $T_3$ of semiconductor wafer 100, to maintain structural integrity of the thinner semiconductor wafer.

Figure 3J:
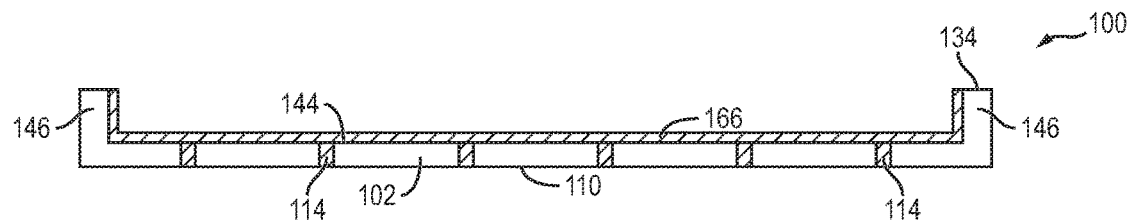

In FIG. 3j, a post-grinding stress relief etch is used to remove or reduce the damage in surface 144 of base substrate material 102 caused by the grinding process. Surface 144 of semiconductor wafer 100 is cleaned with a rinsing solution. An electrically conductive layer 166 is formed over surface 144 using PVD, CVD, electrolytic plating, electroless plating process, evaporation, or other suitable metal deposition process. Conductive layer 166 includes one or more layers of Al, Cu, Sn, Ni, Au, Ag, Ti, TiW, or other suitable electrically conductive material. Conductive layer 166 provides back-side electrical interconnect for semiconductor die 104. Conductive layer 166 is patterned into electrically common or electrically isolated portions according to the function of semiconductor die 104. Backgrinding tape 130 is removed by exposing the tape to ultraviolet (UV) light and peeling off.

In FIG. 3k, semiconductor wafer 100 is mounted with active surface 110 oriented to tape portion 170 of film frame 172. In FIG. 3l, edge support ring 146 is removed to be planar with or just above (10-13 μm) conductive layer 172 or surface 144. In FIG. 3m, semiconductor wafer 100 is removed from film frame 172, inverted, and mounted with conductive layer 166 on surface 144 oriented to tape portion 180 of film frame 182. In FIG. 3n, semiconductor wafer 100 is singulated through saw streets 106 using a saw blade or laser cutting tool 186 or plasma etch into individual semiconductor die 104.

While one or more embodiments have been illustrated and described in detail, the skilled artisan will appreciate that modifications and adaptations to those embodiments may be made without departing from the scope of the present disclosure.

What is claimed:

1. A method of making a semiconductor device, comprising:
    providing a semiconductor wafer including a base material;
    grinding a surface of the semiconductor wafer during a grinding phase using a grinder to remove a portion of the base material;
    lifting the grinder off the surface of the semiconductor wafer during a separation phase while maintaining the grinder positioned over the semiconductor wafer; and
    rinsing the surface of the semiconductor wafer and under the grinder during the separation phase to remove particles.

2. The method of claim 1, further including repeating the grinding phase and separation phase.

3. The method of claim 1, further including rinsing the surface of the semiconductor wafer during the grinding phase and separation phase to remove the particles.

4. The method of claim 1, further including lifting the grinder 3-10 micrometers off the surface of the semiconductor wafer.

5. The method of claim 1, further including pausing movement of the grinder in the downward direction during the separation phase.

6. The method of claim 1, wherein the semiconductor wafer includes an edge support ring.

7. A method of making a semiconductor device, comprising:
    performing a grinding phase on a surface of a semiconductor wafer using a grinder;
    separating the grinder from the surface of the semiconductor wafer during a separation phase with the grinder positioned over the semiconductor wafer; and
    rinsing the surface of the semiconductor wafer and under the grinder during the separation phase.

8. The method of claim 7, further including repeating the grinding phase and separation phase.

9. The method of claim 7, further including rinsing the surface of the semiconductor wafer during the grinding phase and separation phase.

10. The method of claim 7, further including separating the grinder 3-10 micrometers from the surface of the semiconductor wafer.

11. The method of claim 7, further including pausing vertical movement of the grinder during the separation phase.

12. The method of claim 7, further including pausing rotational movement of the grinder during the separation phase.

13. The method of claim 7, wherein the semiconductor wafer includes an edge support ring.

14. A semiconductor wafer processing apparatus, comprising:
    means for performing a grinding phase on a surface of a semiconductor wafer using a grinder;
    means for separating the grinder from the surface of the semiconductor wafer during a separation phase; and
    means for rinsing the surface of the semiconductor wafer and under the grinder.

15. The semiconductor wafer processing apparatus of claim 14, wherein the grinding phase and separation phase are repeated.

16. The semiconductor wafer processing apparatus of claim 14, wherein the surface of the semiconductor wafer is rinsed during the grinding phase and separation phase.

17. The semiconductor wafer processing apparatus of claim 14, wherein the grinder is separated 3-10 micrometers from the surface of the semiconductor wafer.

18. The semiconductor wafer processing apparatus of claim 14, further including means for pausing vertical movement of the grinder during the separation phase.

19. The semiconductor wafer processing apparatus of claim 14, further including means for pausing rotational movement of the grinder during the separation phase.

20. The semiconductor wafer processing apparatus of claim 14, wherein the semiconductor wafer includes an edge support ring.

* * * * *